United States Patent [19]
Moutou et al.

[11] 4,136,352
[45] Jan. 23, 1979

[54] FIELD-EFFECT STRUCTURES

[75] Inventors: Paul C. Moutou; Pierre Gibeau; Jean-Pascal Duchemin, all of Paris, France

[73] Assignee: Thomson-CSF, Paris, France

[21] Appl. No.: 731,099

[22] Filed: Oct. 8, 1976

[30] Foreign Application Priority Data

Oct. 14, 1975 [FR] France .................. 75 31412

[51] Int. Cl.$^2$ .......................................... H01L 29/76
[52] U.S. Cl. ........................................ 357/22; 357/23; 357/80; 357/81

[58] Field of Search ................ 357/23, 22, 80, 81

[56]  References Cited

U.S. PATENT DOCUMENTS

| 3,986,196 | 10/1976 | Decker et al. | 357/22 |
| 4,062,036 | 12/1977 | Yoshida | 357/22 |

Primary Examiner—Edward J. Wojciechowicz
Attorney, Agent, or Firm—Cushman, Darby & Cushman

[57] ABSTRACT

A junction-type field-effect structure has an active layer covered at least in part by a dielectric layer. A metal base is applied to the dielectric layer.

8 Claims, 7 Drawing Figures

NOVEL FIELD-EFFECT STRUCTURES

Field-effect devices with a performed channel and incorporating a junction, comprise an active zone in which a conduction channel, generally n-type, develops, and two electrodes, source and drain, respectively disposed at the two ends of said active layer, the thickness of the latter not exceeding some few tens of microns.

A gate acting as a rectifying junction is deposited upon the active layer. The assembly is arranged upon a semi-insulating substrate. Since the latter is a poor heat conductor these transistors are not available for high-power operation. In another device, the conductivity type of the substrate is opposite to that of the active layer and plays the part of a gate. In this case, there are substantial parasitic capacitances.

The object of the present invention is field-effect structures in which these drawbacks are partly avoided.

Junction-type field-effect structures in accordance with the invention have their active layer, in which the conduction channel develops, rests in part at least, through the medium of a low thickness dielectric layer, on a metal block which is a good heat conductor.

The invention will be better understood from a consideration of the ensuing description and by reference to the attached drawings in which.

The following figures show cross sections of variant embodiment of the invention.

Figure 1:
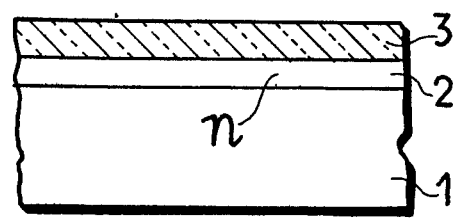
FIGS. 1, 2 and 3 show in section respectively a first example of the structure in accordance with the invention, during the various stages of its manufacture.

In FIG. 1, on an insulating or semiconducting substrate 1, there has been deposited a layer 2 for example of n-type material, which will be the future active layer of the fieldeffect transistor in accordance with the invention.

This layer 2 is for example silicon deposited on the substrate by epitaxy.

On this layer there is deposited a dielectric layer 3 and this may be a silica layer formed by in situ oxydation on the active layer, or deposited by some suitable method.

Figure 2:
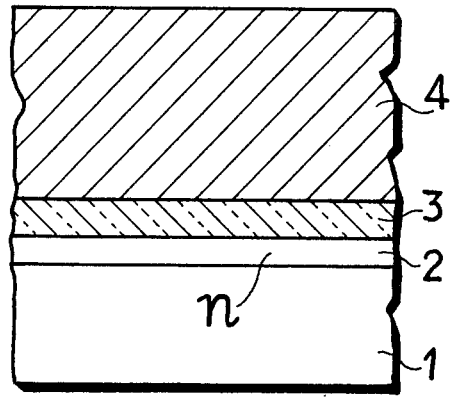

Using known methods (cathode-sputtering, vaporization under vacuum etc...) a metal surface 4 is deposited upon said layer. This layer is grown electrolytically until it has a thickness of for example 10 microns (FIG. 2).

Figure 3:
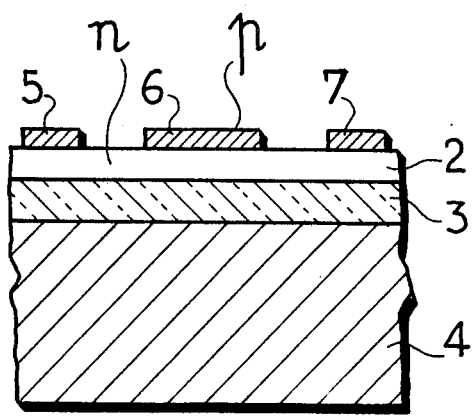

In FIG. 3, by any known method (chemical methods, mechanical methods etc...) the substrate has been removed, and there have been deposited upon the now exposed surface of the active layer, the source 5, gate 6 and drain 7 contacts. The contact 6 is a SCHOTTKY contact forming a rectifying junction in relation to the active layer.

The assembly can be soldered to a metal substrate acting as a heat sink by virtue of its good thermal conductivity.

Other variant embodiments are possible without departing from the scope of the invention.

Figure 4:
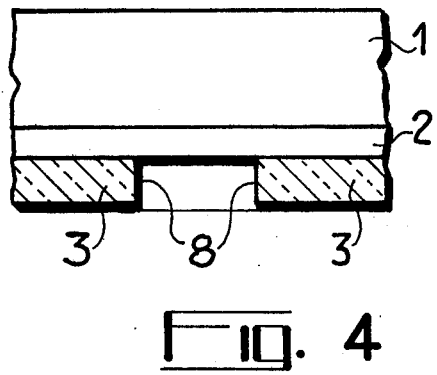
FIG. 4 shows a cross section through the initial structure corresponding to the manufacture of a variant embodiment of the invention.

In FIG. 4, by chemical action across a mask, a window 8 has been formed in the silica layer, baring the layer 2. Thus the metal layer is deposited.

Figure 5:
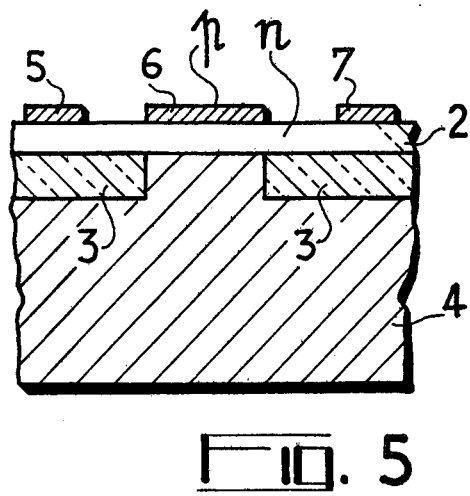
Figure 6:
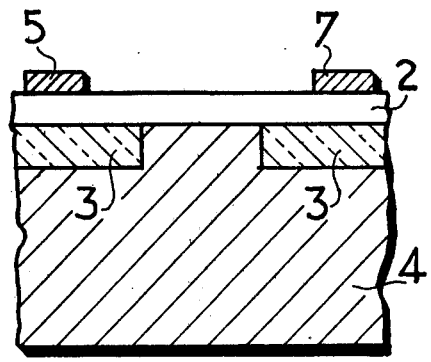

In FIG. 5, the substrate 3 has been removed and the layer 4 of metal forms a contact with the active layer 2. The metal is chosen to form a SCHOTTKY contact with the layer 2 and the metal layer can do duty as a control gate. This arrangement makes it possible to reduce the parasitic capacitances. The electrodes 5, 6 and 7 have been deposited upon the free surface of the layer 2. The transistor thus has two control gates. These two gates, via a connection which has not been shown, can be supplied with the same control voltage thus enabling the canal to be pinched more symmetrically. In FIG. 6, the gate 6 has not been deposited, and the metal layer 4 instead is the gate electrode.

The two electrodes 4 and 6 can also be used as independent electrodes. The types of structures described hereinbefore make it possible to eliminate the parasitic capacitances or at any rate to reduce them.

Figure 7:
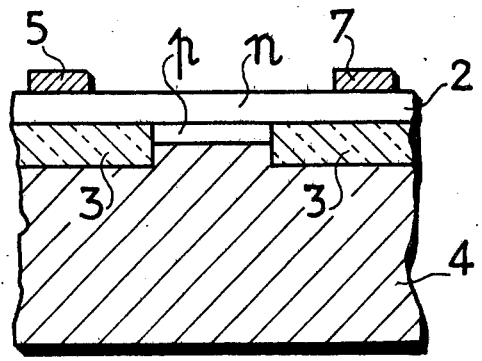

In FIG. 7, in the window 8 on the active zone a p+ type zone 9 has been deposited. This zone, covered by the metal 4, is a junction-type control gate and the latter will then be controlled by a voltage applied to the metal zone with which it forms an ohmic contact. The electrodes 5 and 7 are arranged as before. The advantages of the foregoing structures are as follows:

the previous substrate having been eliminated, its structure and material are no longer of any importance;

thermal dissipation is improved by the metal substrate so that the power dissipation can be increased;

the use of an arbitrary semiconductor for the active zone;

the reduction of the parasitic capacitances when the control gate covers the whole of the structure.

What we claim is:

1. A junction type filed effect transistor comprising a semi-conductive layer, a source and a drain electrode upon one and the same face of said layer a gate electrode forming a rectifying junction with said layer between said source and said drain and covering at least partly the other face of said layer, a dielectric layer, and a metal layer forming a substrate for said transistor and covering said other face and said dielectric layer.

2. A structure as claimed in claim 1, wherein a window is formed in said dielectric layer between said source and said drain.

3. A structure as claimed in claim 2, wherein said metal layer forms in said window a rectifying contact with said semi-conducting layer, and constitutes a control gate.

4. A structure as claimed in claim 2, wherein a control gate is deposited in said window, said metal layer forming with said control gate an ohmic contact.

5. A structure as claimed in claim 2, wherein a control gate is deposited upon said one face, facing said window.

6. A method of manufacturing a junction-type field-effect structure characterized by the following stages:
   (a) deposition of a semiconductor layer on a substrate;
   (b) deposition of a dielectric layer on said layer;
   (c) deposition of a metal layer on said dielectric layer;
   (d) removal of said substrate by chemical or mechanical machining in order to bare said semiconductor layer;
   (e) deposition of the source and drain electrodes on the face exposed after the elimination of the substrate from said active layer.

7. A method as claimed in claim 6, comprising prior to the deposition of said metal layer the formation of a window in said dielectric layer in order to place said metal layer and said semiconductor layer in direct contact with one another, the two layers forming a rectifying contact.

8. A method as claimed in claim 6, characterized by the formation of a window in said dielectric layer, the formation in said window of a second semiconducting layer forming a rectifying contact with said semiconductor layer, said second layer constituting one of the control gates of the structure.

* * * * *